United States Patent [19]

Dines

[11] 4,303,291
[45] Dec. 1, 1981

[54] METHOD OF SEATING CONNECTOR TERMINALS ON CIRCUIT BOARD CONTACT PADS

[75] Inventor: David R. Dines, Oklahoma City, Okla.

[73] Assignee: Western Electric Company, Inc., New York, N.Y.

[21] Appl. No.: 210,073

[22] Filed: Nov. 24, 1980

[51] Int. Cl.³ ............................................... H05K 1/00
[52] U.S. Cl. .................................. 339/17 B; 430/311; 430/317; 427/96; 174/68.5
[58] Field of Search ............... 430/311, 312, 317, 319; 339/17 R, 17 A, 17 C, 17 CF, 17 E, 17 LM; 174/68.5; 427/96

[56] References Cited

U.S. PATENT DOCUMENTS 4,211,890  7/1980  Sado .................................... 174/68.5

*Primary Examiner*—John D. Welsh
*Attorney, Agent, or Firm*—R. P. Miller

[57] ABSTRACT

A protective coating (13) on a printed circuit board (10) is formed to extend into spaces (22) between spaced contact pads (16) adhered along an edge portion of the board. The protective coating is selected to be thicker than the thickness of the contact pads to provide fillets between the contact pads that function to form pockets (33) with the contact pads (16) being at the bottom of the pockets. When a multi-terminal connector (21) is assembled on the edge of the circuit board, the terminals (18) tend to fall into and seat within the pockets.

9 Claims, 4 Drawing Figures

U.S. Patent Dec. 1, 1981 Sheet 2 of 2 4,303,291
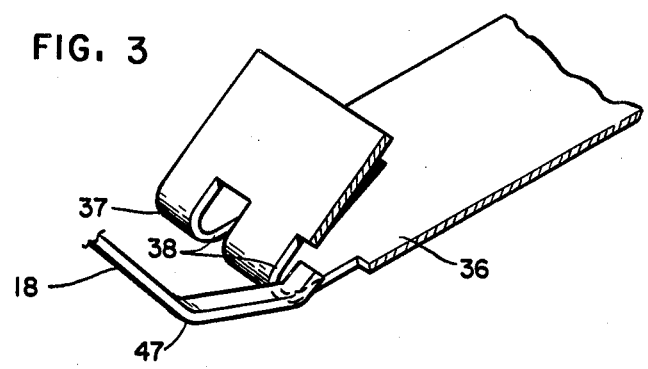
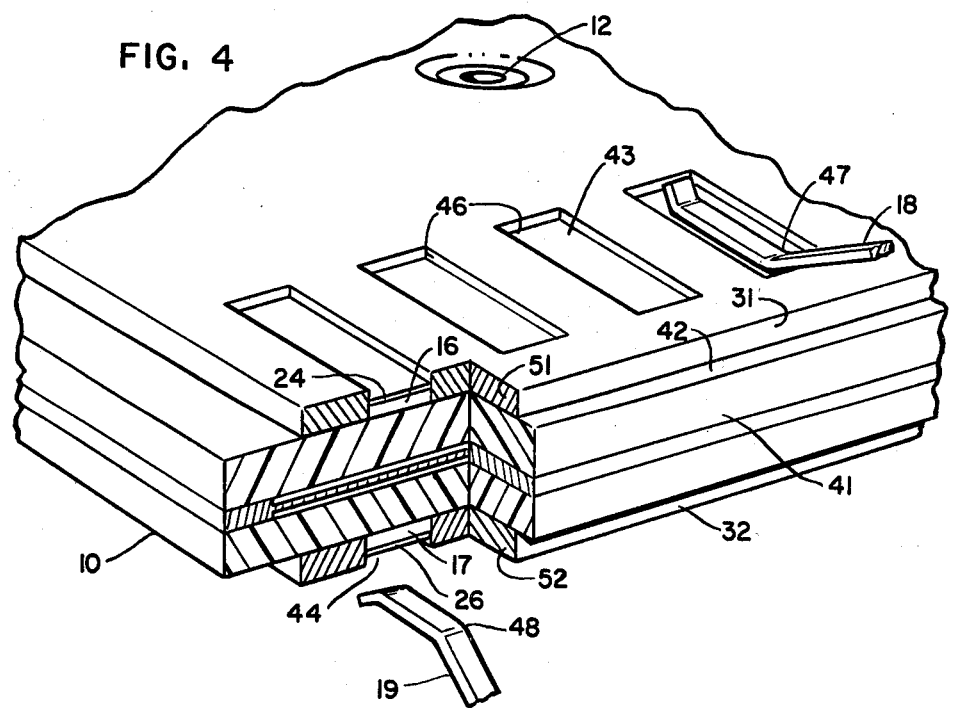

METHOD OF SEATING CONNECTOR TERMINALS ON CIRCUIT BOARD CONTACT PADS

FIELD OF THE INVENTION

This invention relates to a method of insuring the seating of connector terminals onto contact pads formed on a printed circuit board and, more particularly, to a method of forming seats in a pair of outer layers of a multi-layer circuit board for receiving a pair of opposed arrays of spring-like terminals projecting from a connector so that each terminal engages a contact pad within an associated seat.

TECHNICAL BACKGROUND

Many printed circuit or wiring boards are interconnected to other circuit devices and equipments by forming contact pads along one or more edge sections of the boards and contacting these pads with terminals projecting from a connector housing. In some instances the connector terminals are permanently secured to the pads by coating the pads with solder and engaging the terminals with the pads and then reflowing the solder. In such operations great care must be exercised to insure that each terminal engages only one contact pad.

The problem is particularly acute in manufacturing large size circuit boards with large numbers of closely spaced small contact pads formed on both the upper and underside of the board that are engaged by two arrays of closely spaced thin spring wire terminals. Inasmuch as the contact pads project from the surface of the circuit board, there are formed discrete grooves between each pair of pads. When assembling the connector with the board, there is a tendency for the terminals to fall from the contact pads and into the grooves, or ride into the grooves during the initial assembly of the connector onto the board.

In some instances one terminal is positioned in a groove so as to engage neither of the adjacent contact pads; thus, a subsequent reflow soldering operation is ineffective to secure a terminal to a contact pad. The terminal may be positioned askew of a pair of terminals so that an ensuing reflow soldering operation results in the securing of the terminal in bridging relation to two adjacent contact pads. In other instances, a pair of connector terminals may fall within a groove while engaging portions of adjacent contact pads so that the subsequent reflow solder operation function to establish a conductive bridge between adjacent contact pads. Prior to the reflow soldering of these boards, it is necessary that the terminal positions be visually checked and, as required, the terminals must be manually repositioned to overlie individual contact pads. These operations are very tedious and exacting, requiring exorbitant amounts of shop time.

SUMMARY OF THE INVENTION

This invention contemplates, among other things, a method of fabricating insulating seats about contact pads on the edge of a printed circuit board which function to receive and properly position closely spaced thin wire terminals extending from a connector, cable or similar connecting device.

More particularly, in the manufacture of one type of printed circuit board, a number of layers of insulating material having discrete circuit paths formed thereon are stacked, pressed and heated to form what is known as a multi-layer printed wiring board. These boards are fabricated with outer insulating layers that are configured by a photodevelopment process so that the outer layers do not extend to the edge of the underlying board but rather are recessed therefrom to expose rows of contact pads formed along upper and lower exposed edges. During fabrication, the contact pads may be coated with a solder which may be subsequently reflowed to secure the contact pads to terminals extending from a connector or left clean so as to be solderable.

The present invention contemplates extending the overlying photosensitive insulating layers into position to overlie the contact pads. The masks used to develop the outer photosensitive layers are provided with sections to block out the transmission of light to the contact pads. The outer layers of insulating material are selected to be thicker than the contact pads. The assembled masks and boards are subjected to ultraviolet light which sets the exposed portions of the outer photosensitive insulating layers.

The undeveloped portion of the outer photosensitive layers are removed leaving the contact pads exposed with insulating fillets of set photosensitive material between the respective contact pads. These fillets are of greater height than the contact pads, thus, when the connector is assembled on the circuit board, the terminals will tend to ride into the seats or pockets formed by the fillets. Any terminal that is hung up on a fillet may be easily raked to drop into the proper adjacent contact pad seat. The assembled connector and circuit board are subject to heat so that the solder is reflowed to secure each terminal with each contact pad or soldered directly if clean contact pads are utilized.

DESCRIPTION OF THE DRAWINGS

Other features and advantages of the invention will be apparent upon consideration of the following detailed description when considered in conjunction with the drawings, wherein:

FIG. 3 is a perspective view of a rake or comb that may be used to facilitate the seating of the connector terminals onto the wiring board contact pads, and FIG. 4 discloses a circuit board constructed in accordance with a further embodiment of the invention wherein photo-resist insulation layers on the top and bottom of the board are processed to form seats over the contact pads that are completely surrounded by insulating material so as to further insure that connector terminals are individually seated on the individual contact pads and to protect the integrity of the thin web of insulation betweem contact pads.

DETAILED DESCRIPTION

Figure 1:
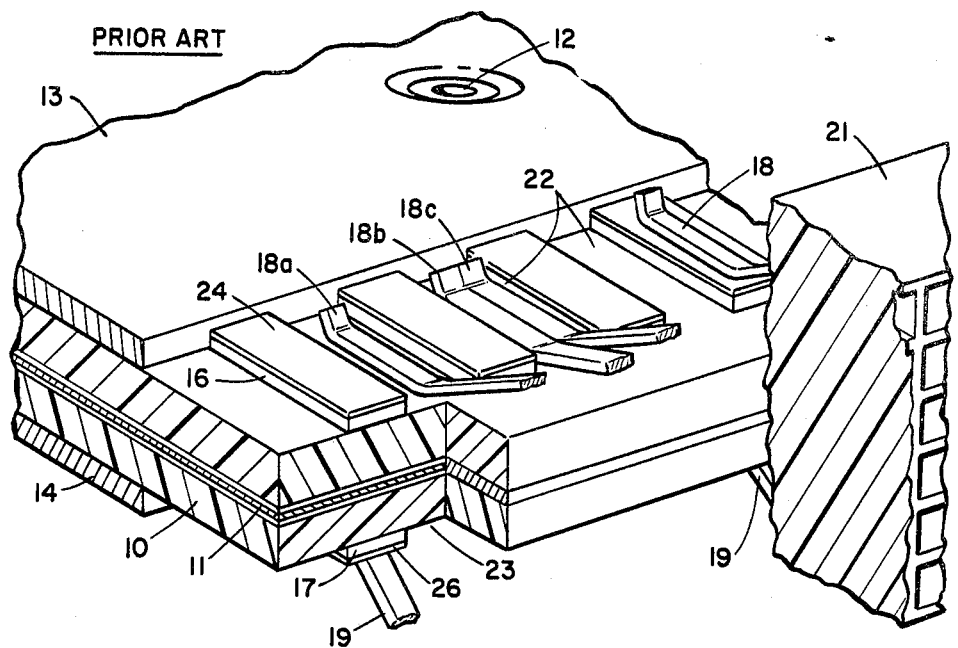
FIG. 1 illustrates, in accordance with the prior art, an assembly of a multi-layered printed wiring board with a connector having large arrays of projecting terminals to engage contact pads formed along one top edge and one bottom edge of the circuit board.

Referring to FIG. 1, the invention will be described with respect to a printed wiring board 10. The particular wiring board illustrated in FIG. 1 comprises a number of thin plastic layers 11, each of which is coated with a thin copper film that is photo-etched to define various circuit paths. One of the layers may be completely coated with copper to form a ground plane, while another layer is also completely coated to form a power supply layer.

Circuit paths on one layer may be connected to circuit paths on other layers by means of plated through-holes 12. The plated through-holes 12 also function as receptacles for leads emanating from various circuit components, such as resistors, transistors, inductors, capacitors or integrated circuits packaged as DIP's (Dual In-Line Package). In the manufacture of the circuit board, the outer layers are coated with photosensitive insulating sheets 13 and 14, such as sold under the trademark Riston ® by the E. I. DuPont de Nemours and Company of Wilmington, Del. These sheets serve to protect the circuit paths on the outer layers of the board. The circuits may be formed on both the bottom and upper exposed layers. The circuits on the bottom and upper layers terminate in contact pads 16 and 17 which serve as means for connecting the circuit paths to terminals 18 and 19 angularly extending in two arrays from an insulating connector block which is fragmentarily illustrated in FIG. 1 and designated by the reference numeral 21.

It will be noted that the contact pads 16 and 17 are separated by spaces 22 and 23. These spaces 22 and 23 are recessed from the top planes of the contact pads 16 and 17. The contact pads 16 and 17 may be coated with thin layers of solder 24 and 26. The terminals 18 and 19 are formed of thin spring-like wires and are very closely spaced at their ends to form the two arrays of terminals that are to be assembled on the solder coated contact pads 16 and 17. When the connector block is moved to advance the terminals over the contact pads, there is a tendency for certain of the terminals, such as terminal 18a, to drop into a space 22. In other instances, a pair of terminals, such as 18b and 18c, drop into a space so as to engage each other and bridge the adjacent contact pads.

Prior to soldering or heating the circuit board to reflow the solder layers 24 and 26 to secure the terminals in place, an operator must carefully examine the terminals and manually position the terminals 18 on the pads 16 and 17. This is accomplished by using a pick or comb, but the operation is a very tedious and time consuming effort. One of the objects of the present invention is to provide a method of fabricating a board which assures that the terminals 18 and 19 seat on the contact pads 16 and 17 rather than in the spaces between the contact pads.

Figure 2:
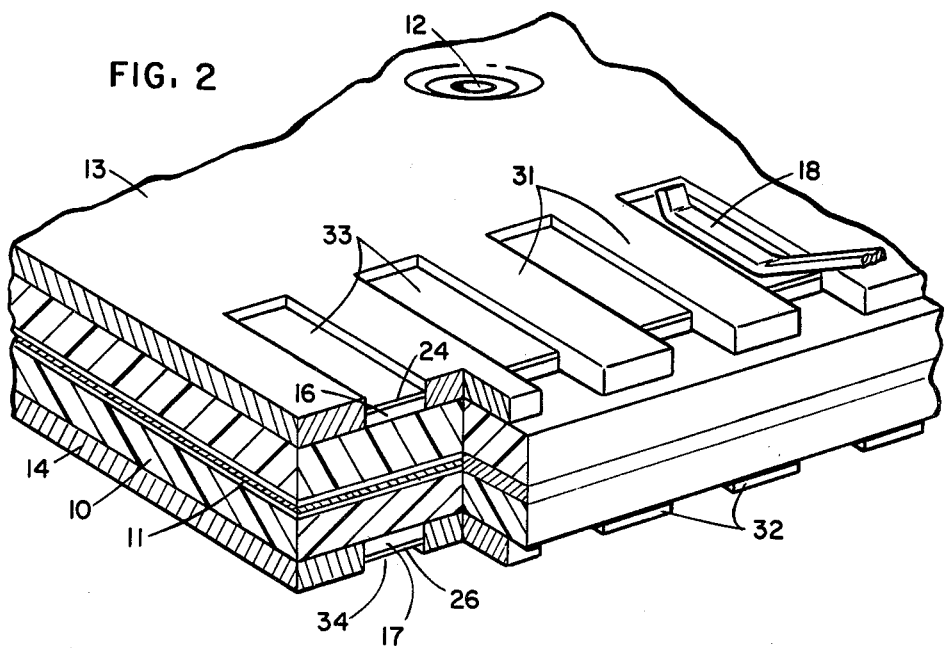
FIG. 2 discloses a circuit board that is constructed to provide fillets between the contact pads which, in turn, act to provide seats for the receipt of the connector terminals in accordance with the principles of the present invention.

More particularly, referring to FIG. 2, there is shown a printed wiring board similar to that shown in FIG. 1 which has been modified to incorporate the expedients of the present invention. When the outer photosensitive layers 13 and 14 are photodeveloped, the mask utilized provides light transmission spots which overlie the spaces 22 and 23 between pairs of contact pads 16 and 17. The assembled mask and wiring board are subjected to ultraviolet light which develops and sets portions of the photosensitive layer in the spaces 22 and 23 to form fillets 31 and 32. The layers 13 and 14 are thicker than the height of the contact pads 16 and 17, hence, the fillets 31 and 32 have outer surfaces which are at higher elevations than the top surfaces of the contact pads 16 and 17. In effect, this construction forms seats or pockets 33 and 34 surrounded on three sides by the set photosensitive layers 31 and 32.

When the connector block 21 is now moved toward the printed wiring board 10, the spring-like terminals 18 and 19 tend to ride into or fall within the seats 33 and 34. If any of the terminals hang up on the fillets 31 or 32, their elevated positions are readily discernible and the terminals may be easily pushed into the adjacent proper seats 33 and 34. In order to assist the positioning of the terminals in the seats, a rake or comb, such as designated by the reference numeral 36 in FIG. 3, may be used. The rake consists of a thin sheet of metal, such as titanium, which is bent back to form a curved edge 37 along which are formed a number of slots 38. The spacing of the slots 38 is in accordance with the proper spacing of the terminals 18 or 19. It is a relatively simple matter to manipulate the rake 36 to engage the terminals 18 or 19 in the slots 39 so as to shift the terminals into the proper seats 33 and 34. Following seating of the terminals in the seats, the printed wiring board 10 is soldered or subjected to heat to reflow the solder layers 24 and 26 to secure the terminals 18 and 19 on the contact pads 16 and 17.

A further modification of the invention is illustrated in FIG. 4. In this instance the photosensitive outer layers of plastic material are formed to extend over and beyond the contact pads 16 and 17 so as to approach an edge 41 of the circuit board 10. A small margin 42 between the edge 41 and the photosensitive layer 31 may be provided. The photosensitive layer 32 placed on the underside of the printed wiring board is selected to be of a similar size to provide a small edge margin similar to margin 42. In this instance, masks are utilized having dark spots which overlike all or substantial portions of the contact pads 16 and 17 but leave exposed the forward portions 43 and 44 of the layers 31 and 32. The photosensitive layers are again subjected to ultraviolet light to set the exposed sections of the layers. The areas of the photosensitive layer overlying the contact pads 16 and 17 are not exposed so that when the mask is removed and the unset portions of the photosensitive layers are removed, seats or pockets 46 are formed which are completely surrounded by the set portions of the photosensitive layer 31. Similar pockets are formed to overlie the contact pads 17 on the underside of the board. It will be noted that the respective array of the spring terminals 18 and 19 have elbow sections 47 and 48 which are biased or flexed away from each other so that the terminals pop into the pockets overlying the contact pads when the connector block 21 is pushed toward and onto the contact pad edge of the printed wiring board.

It will be noted that the seats 46 are now completely enclosed by forward set insulating sections 51 and 52 which firmly adhere to the upper and lower edge marginal surfaces of the printed wiring board. Stated another way, the seats are now completely surrounded by set sections of the insulating layers 31 and 32. When the printed wiring board is now subjected to heat to reflow the solder layers 24 and 26, any tendency of the set photosensitive layers to peel away from the surface of the board is substantially alleviated. The rake shown in FIG. 3 may be easily utilized to shift and move any terminals hung up on the fillets into the associated pockets 46 whereafter the rake is removed and then the soldering operation is performed.

Heretofore, in many mass or selective soldering operations, a heat conductive metallic tool, e.g., a comb or a rake, was used to position the connector terminals over the printed circuit board contact pads. In these instances, the tool was also used to hold the positioned terminals during the soldering operation. Use of such a tool requires the application of an added amount of heat during the soldering operation to compensate for the heat dissipated by the tool. The employment of the terminal positioning pockets or seats of the present invention obviates the need for such tools and, thus, reduces the amount of heat required to perform the soldering operations. Manifestly, with a reduced heat requirement there is a consequent reduction in the possibility of heat peeling of the contact pads.

Another advantage of the present invention is the reduction of heat transfer during the soldering or the solder reflow operation to the junctures of the undersurfaces of the contact pads 16 and 17 with the upper surfaces of the circuit boards to which the contact pads are adhered. The insulating fillets formed between and around the contact pads act as thermo-resists, thus reducing the heat applied to these junctures thereby alleviating the possibility of the contact pads being loosened or peeled from the circuit board.

In a further embodiment it may not be necessary to form the fillet so that the top surfaces of the fillets project above the top surfaces of the contact pads. In this instance, the photosensitive layer is selected to have a thickness which corresponds to the height of the contact pads so the top surfaces of the fillets are in the same plane as the plane of the top surfaces of the contact pads. With this construction, the connector terminals do not lodge between the contact pads so that any conductor terminals assembled onto the fillets may be easily repositioned to overlie the contact pads by manipulation of a pick or by a simple combing operation.

Further, the method of the invention may be practiced with other types of photosensitive layers wherein the areas exposed to light are not set and the areas blocked and masked from light are set during the photodevelopment process. The resultant circuit board will be the same with either photodevelopment processes, that is, the spaces between the contact pads will be filled with fillets having heights that are the same as or greater than the heights of the contact pads.

What is claimed is:

1. A method of forming seats on a printed wiring board to receive terminals extending from a connector, which comprises:
   forming a series of parallel contact pads along one edge section of one surface of printed wiring board, and
   applying an insulating layer over said one surface with sections of said layer extending as fillets between said contact pads, said fillets being thicker than the thickness of said contact pads to form recessed seats to receive the terminals.

2. A method of fabricating a printed circuit board, which comprises:
   forming a circuit board with circuits running to contact paths extending in spaced relation along one marginal edge of the board;
   placing a photosensitive layer of insulating material over the contacts and the spaces therebetween, and said layer being at least as thick as the height of the contact pads; and
   developing the photosensitive layer to form insulating fillets in the spaces between the contact pads, the heights of which are at least equal to the heights of the contact pads.

3. A method as defined in claim 2, wherein the step of forming the circuit board includes forming spaced contact pads on both the top and bottom marginal edges of the board; and
   photosensitive layers are placed over both top and bottom contact pads to provide fillets between both top and bottom contact pads.

4. A method as defined in claim 2, wherein the photosensitive layers completely overlie and extend beyond the contact pads, and the photosensitive layer is developed to form insulating fillets about all sides of the contact pads to provide pockets having the exposed contact pads seated at the bottom of the pockets.

5. A method of fabricating a printed circuit board, which comprises:
   forming a printed circuit board with circuit paths running to contact pads spaced along a marginal surface of the board;
   placing a photosensitive layer of insulating material over the board to overlie the contact pads;
   placing a mask over the photosensitive layer with dark spots overlaying the contact pads;
   subjecting the photosensitive layer to light to develop and set the portions of layer overlaying the spaces between the contact pads; and
   removing the undeveloped portions of the photosensitive layers to form fillets of insulating material in the spaces between the contact layers.

6. A method as defined in claim 5, wherein the photosensitive layer is thicker than the height of the contact pads, and the fillets form seats about the contact pads.

7. A method as defined in claim 2, wherein the photosensitive layer is extended to project beyond the contact pads, and the fillets are formed to completely surround the contact pads to form pockets around the contact pads.

8. A method of aligning terminals projecting from a connector with like spaced contact pads arrayed in parallel along the edge of a circuit board, which comprises:
   depositing a photoresist layer over the contact pads and the spaces between the pads, said layer being thicker than the thickness of the pads;
   placing a mask over the contact pads leaving exposed the portions of the layer of photoresist overlaying the spaces between the contact pads;
   subjecting the exposed portions of the photoresist to light to set the photoresist; and
   removing the mask and the unexposed photoresist to leave fillets having heights greater than the heights of the contact pads so that upon assembly of the connector with the circuit board, the terminals tend to fall into the grooves between the fillets and onto the contact pads.

9. A method as set forth in claim 8, wherein the contact pads are coated with a layer of solder and the solder is heated and reflowed within the seat to secure the terminals to the contact pads.

* * * * *